US006735353B2

(12) United States Patent
Hirata et al.

(10) Patent No.: US 6,735,353 B2
(45) Date of Patent: May 11, 2004

(54) MODULE FOR OPTICAL TRANSMITTER

(75) Inventors: Koji Hirata, Jimokuji (JP); Masataka Shirai, Higashimurayama (JP); Tomoyoshi Mishima, Shiki (JP)

(73) Assignees: Hitachi, Ltd., Tokyo (JP); Hitachi ULSI Systems Co. Ltd., Tokyo (JP)

( * ) Notice: Subject to any disclaimer, the term of this patent is extended or adjusted under 35 U.S.C. 154(b) by 7 days.

(21) Appl. No.: 10/301,641

(22) Filed: Nov. 22, 2002

(65) Prior Publication Data

US 2003/0142928 A1 Jul. 31, 2003

(30) Foreign Application Priority Data

Jan. 29, 2002 (JP) ........................................ 2002-019554

(51) Int. Cl.$^7$ ................................................ G02B 6/36
(52) U.S. Cl. .............................. 385/14; 385/88; 385/92
(58) Field of Search ............................. 385/14, 53, 77, 385/78, 88, 92, 139

(56) References Cited

U.S. PATENT DOCUMENTS

| | | | | |
|---|---|---|---|---|
| 5,611,008 A | * | 3/1997 | Yap ............................... | 385/14 |
| 5,740,191 A | * | 4/1998 | Kasper et al. ................. | 372/34 |
| 5,937,124 A | * | 8/1999 | Roff .............................. | 385/88 |
| 5,960,135 A | * | 9/1999 | Ozawa .......................... | 385/24 |
| 6,213,650 B1 | * | 4/2001 | Moriyama et al. ............ | 385/88 |
| 6,490,379 B2 | * | 12/2002 | Boudreau et al. ............. | 385/14 |
| 6,655,856 B2 | * | 12/2003 | Nakanishi et al. ............ | 385/94 |
| 6,678,432 B2 | * | 1/2004 | Shigeta et al. ................ | 385/14 |

OTHER PUBLICATIONS

Electronic Technology, 2000, Nov. issue, pp. 7–8 (No Translation).

Koichi Wantanabe, Hideyuki Suzuki, Kyosuke Ishikawa, Hiroyuki Chiba, Masataka Shirai, Koji Hirata, Kiyoshi Ouchi, Tomonori Tanoue, and Ryoji Takeyari, "40 Gb/s TDM fully–monolithically integrated transmitter based on InP/InGaAs HBT technology," Fifth Asia–Pacific Conference on Communications and Fourth Optoelectronics Communications Conference, APCC/OECC '99, Proceedings, pp. 12–13.

* cited by examiner

Primary Examiner—Dean A. Reichard
Assistant Examiner—Adolfo Nino
(74) Attorney, Agent, or Firm—Reed Smith LLP; Stanley P. Fisher, Esq.; Juan Carlos A. Marquez, Esq.

(57) ABSTRACT

The present invention provides a module for optical transmitter formed as an opto-electronic integrated circuit (OEIC) for reducing the heat generated at a driver circuit for modulator and stabilizing the thermal fluctuation in an optical modulator.

For promoting the heat dissipation of the top face of the driver circuit for modulator of the OEIC chip, a protruding cooling plate is formed on metal wiring. A part of a semiconductor substrate present between the optical modulator and the driver circuit for modulator is thinned or removed. Further, a carrier for mounting thereon the OEIC chip is divided into two parts, and a peltier cooler is connected to the optical modulator side. This achieves the promotion of heat dissipation from the top face of the driver circuit for modulator, the thermal separation between the optical modulator and the driver circuit for modulator, and the temperature stabilization due to the peltier cooler.

The temperature rise and the temperature change of the optical modulator are suppressed, so that it is possible to manufacture a module for optical transmitter showing no characteristic deterioration, in which an optical modulator and a driver circuit for modulator are formed as an OEIC chip.

10 Claims, 12 Drawing Sheets

MODULE FOR OPTICAL TRANSMITTER

BACKGROUND OF THE INVENTION

1. Field of the Invention

The present invention relates to a module for optical transmitter including an opto-electronic integrated circuit chip obtained by forming an opto-electronic optical modulator and a driver circuit for modulator as an integrated circuit, and an optical transmission system using the same.

2. Description of the Related Art

In a conventional optical transmitter, a multiplexer, an optical modulator, and a driver circuit for modulator are different modules, and the respective modules are provided on the base of the optical transmitter. Further, the connection between the respective modules is established by a characteristic impedance-matched cable or connector. The photograph of the external view thereof is disclosed in "Electronic Technology", 2000, Nov. issue, pp. 7–8.

Further, the system block diagram thereof is disclosed in "FIFTH ASIA-PACIFIC CONFERENCE ON COMMUNICATIONS AND FOURTH OPTOELECTRONICS COMMUNICATIONS CONFERENCE, APCC/OECC'99, PROCEEDINGS", pp. 12–13.

SUMMARY OF THE INVENTION

In the foregoing prior art, a multiplexer module, a module of a driver circuit for optical modulator, and a module of an optical modulator are connected by a cable or a connector. Accordingly, the connection loss of an electric signal occurs at the connection part, resulting in degradation in response characteristic from the electric signal to an optical signal.

Further, the area occupied by the modules is increased due to the cable or the connector, resulting in a large transmitter.

The present inventors prototyped a module for optical transmitter wherein an optical modulator and a driver circuit for modulator are formed as an OEIC for implementing a compact high-performance optical transmitter. FIG. 2 is a top view of the interior of the prototyped module for optical transmitter seen by removing the upper part of the storage case thereof. FIG. 3 is a side view seen from the cross section of the portion along line D-D" shown in FIG. 2. FIG. 4 is a perspective view of the prototyped OEIC chip. FIG. 5 is a cross sectional view of the portion along line E-E' shown in FIG. 4.

For the prototyped module for optical transmitter, as shown in FIG. 2, an OEIC chip 80 is connected to an Au (gold)-plated wiring pattern 82 formed on a ceramic substrate 81 by a bonding wire 83. A thermister 84 for detecting the inside temperature of the module is also connected thereto similarly, and connected to an input/output (I/O) terminal 86 by a lead wire 85.

A storage case 87 made of a metal serving as a housing is provided with a connector 88 for inputting a high-frequency signal to the OEIC chip 80 and a terminal 89 for applying dc voltage. Each terminal is connected to the Au-plated pattern 82 formed on the ceramic substrate 81 by each lead wire 85. A single mode fiber 90 is connected to an isolator 91, and inputs and outputs optical signals to and from the OEIC chip 80 through an aspherical lens 92 for fiber coupling.

Further, as shown in FIG. 3, the OEIC chip 80 is fixed on a carrier 93 made of CuW (copper tungsten). Further, the carrier 93 is connected to a peltier cooler 94, and placed on the bottom 95 of the case 87. Thus, the module is so configured that the OEIC chip 80 is cooled by passage of a prescribed current through the I/O terminal 96 of the peltier cooler 94.

Further, for the prototyped OEIC chip 80, as shown in FIGS. 4 and 5, an opto-electronic optical modulator 97 and a driver circuit 98 for modulator are formed on the same InP substrate 99. Further, a characteristic impedance-matched transmission line (G-S-G line) 100 composed of ground wire G-signal wire S-ground wire G for connecting the optical modulator 97 and the driver circuit 98, a pad 101 for input signal, and a pad 102 for dc bias are included therein. An interlayer insulating film 103 is formed under the respective pads 101 and 102, and the transmission line 100. To the opto-electronic optical modulator 97, an optical waveguide 104 is connected. Further, the substrate 99 made of InP has been reduced in thickness to 100 $\mu$m, implementing such a configuration as to enhance the heat dissipation effect.

The present inventors mounted the foregoing prototyped module for optical transmitter in an optical transceiver system, and evaluated the characteristics. As a result, they found that the module for optical transmitter using the OEIC chip 80 is more degraded in terms of optical transmission characteristics than the one manufactured by using separate modules.

Further, the present inventors considered that this is caused by the thermal transmission from the driver circuit 98 for modulator with large power consumption to the optical modulator 97, and performed the numerical analysis on the thermal resistance for defining the thermal transmission path.

FIG. 6 shows a simplified thermal path of the prototyped module for optical transmitter. This thermal path is composed of the thermal resistance Rth1 of the semiconductor substrate 99, the thermal resistance Rth2 of the wiring metal formed on the surface of the OEIC chip 80, the thermal resistance Rth3 of the gas filled in the module for optical transmitter, the input power P1 of the OEIC chip 80, the input power P2 of the peltier cooler 94, the temperature T1 of the driver circuit 98 for modulator, the temperature T2 of the optical modulator 97 portion, and the ambient temperature Ta.

The thermal resistances Rth1 to Rth3 of the respective elements are expressed by the following equation (1).

$$Rthn = L/\lambda A \quad (1)$$

wherein n=1, 2, or 3; L denotes the distance between two points of the optical modulator and the driver circuit for modulator; $\lambda$, the thermal concuctivity; and A, the cross-sectional area.

The analysis was performed assuming as follows: the distance L is 1 mm; the thickness of the wire, 5 $\mu$m; the width of the wire, 1 mm; and the width of the OEIC chip, 1.7 mm. As a result, the thermal resistance Rth2 on the substrate surface was 250° C./W. In contrast, the thermal resistance Rth1 of the substrate portion was 33.4° C./W, which is about 13% of the thermal resistance of the substrate surface.

The prototyped module for optical transmitter is an enclosed housing. Accordingly, the thermal transmission by a gas is considered to be smaller than the thermal transmission from the wiring metal. Thus, the thermal resistance Rth between the optical modulator 97 and the driver circuit 98 for modulator is determined two dimensionally in a simplified manner, and it can be expressed as the following equation (2):

$$Rth = (Rth1 \times Rth2)/(Rth1 + Rth2) \quad (2)$$

The thermal resistance between the two points can be considered as a simple combined resistance. Therefore, it has been shown that the heat generated at the driver circuit 98 for modulator was conducted mainly through the substrate 99 to the optical modulator 97 to degrade the extinction characteristic of the optical modulator 97.

Further, although the peltier cooler was disposed in the prototyped module for optical transmitter, presumably, it was not capable of controlling the temperature rise and the temperature change in the optical modulator 97 due to the thermal path along the lateral direction of the substrate 99 from the driver circuit 98 for modulator.

Herein, simple provision of a large-capacity peltier cooler exhibiting a large cooling effect may also be mentioned as one of the countermeasures. This, however, leads to an increase in power consumption of the module for optical transmitter itself, and hence is not a preferred countermeasure from the viewpoint of implementing lower power consumption of the optical transmitter.

Therefore, it is essential to solve the thermal transfer problem for improving the performance than that of the conventional optical transmitter.

Under such circumstances, it is therefore an object of the present invention to provide a module for optical transmitter mounting therein an OEIC chip in which an optical modulator and a driver circuit for modulator are integrated for implementing a high-performance compact optical transmitter.

Further, it is another object of the present invention to provide an optical transmission system using the module for optical transmitter mounting the OEIC chip.

Still further, it is a still other object of the present invention to provide a technology for reducing the temperature rise in the driver circuit for modulator in the OEIC chip.

Furthermore, it is a still further object of the present invention to provide a technology for stabilizing the thermal fluctuations in the optical modulator.

The forgoing objective module for transmitter is implemented by using the following configurations (1) and (2).

(1) Cooling plates are disposed on the wiring of the OEIC chip to increase the cooling area; and (2) Apart of the semiconductor substrate immediately under the transmission line establishing the connection between the opto-electronic optical modulator and the driver circuit for modulator is reduced in thickness, or removed. In addition, the carrier mounting the OEIC chip thereon is divided into two parts, and further, a cooling element such as a peltier cooler is mounted on the optical modulator side. Namely, with the configuration (1), the heating density is reduced to reduce the thermal resistance, so that a reduction in the temperature rise in the driver circuit for modulator is implemented. Whereas, with the configuration (2), the heat conductivity via the substrate is reduced, and the opto-electronic optical modulator is cooled with efficiency, thereby achieving the thermal stabilization thereof.

Further, for the foregoing objective optical transmission system, the module for optical transmitter using the configurations (1) and (2) is used for the optical transmitter in the optical transmission system. As a result, it is possible to implement an optical transmission system which is compact and excellent in transmission characteristic because of the reduced number of modules.

Herein, one example of typical means of the module for optical transmitter in accordance with the present invention will be shown as follows.

A module for optical transmitter of the present invention is a module for optical transmitter mounting therein an OEIC chip including an opto-electronic optical modulator and a driver circuit for modulator formed as an opto-electronic integrated circuit on the same semiconductor substrate, characterized in that the OEIC chip has first and second semiconductor substrate areas having a large thickness and separated by a groove formed by thinning a part of the semiconductor substrate immediately under a wiring metal for connecting the opto-electronic optical modulator and the driver circuit for modulator, the opto-electronic optical modulator is formed on the first semiconductor substrate area side, and the driver circuit for modulator is formed on the second semiconductor substrate area side, a first carrier for mounting the first semiconductor substrate area side of the OEIC chip, and a second carrier for mounting the second semiconductor area side of the OEIC chip are placed apart from each other, a peltier cooler is connected to the first carrier, and further a protruding cooling plate is formed on the driver circuit for modulator on the OEIC chip.

DETAILED DESCRIPTION OF THE PREFERRED EMBODIMENTS

Below, the preferred embodiments of a module for optical transmitter in accordance with the present invention will be described in details by reference to the accompanying drawings.

(Embodiment 1)

Figure 1:
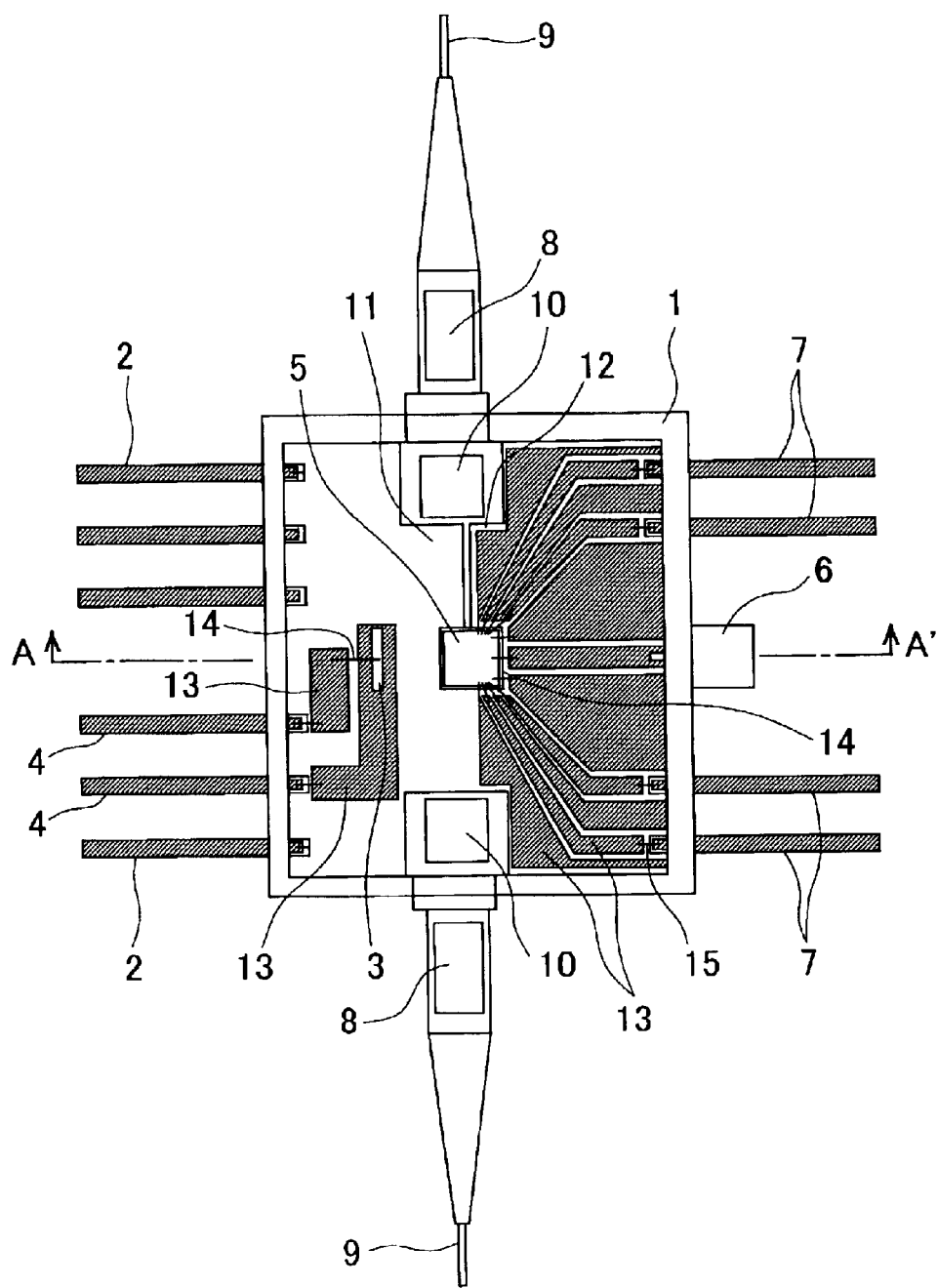
FIG. 1 is a view for showing a first embodiment of a module for optical transmitter in accordance with the present invention, which is a top view of the interior thereof seen by removing the upper part of a storage case.
Figure 2:
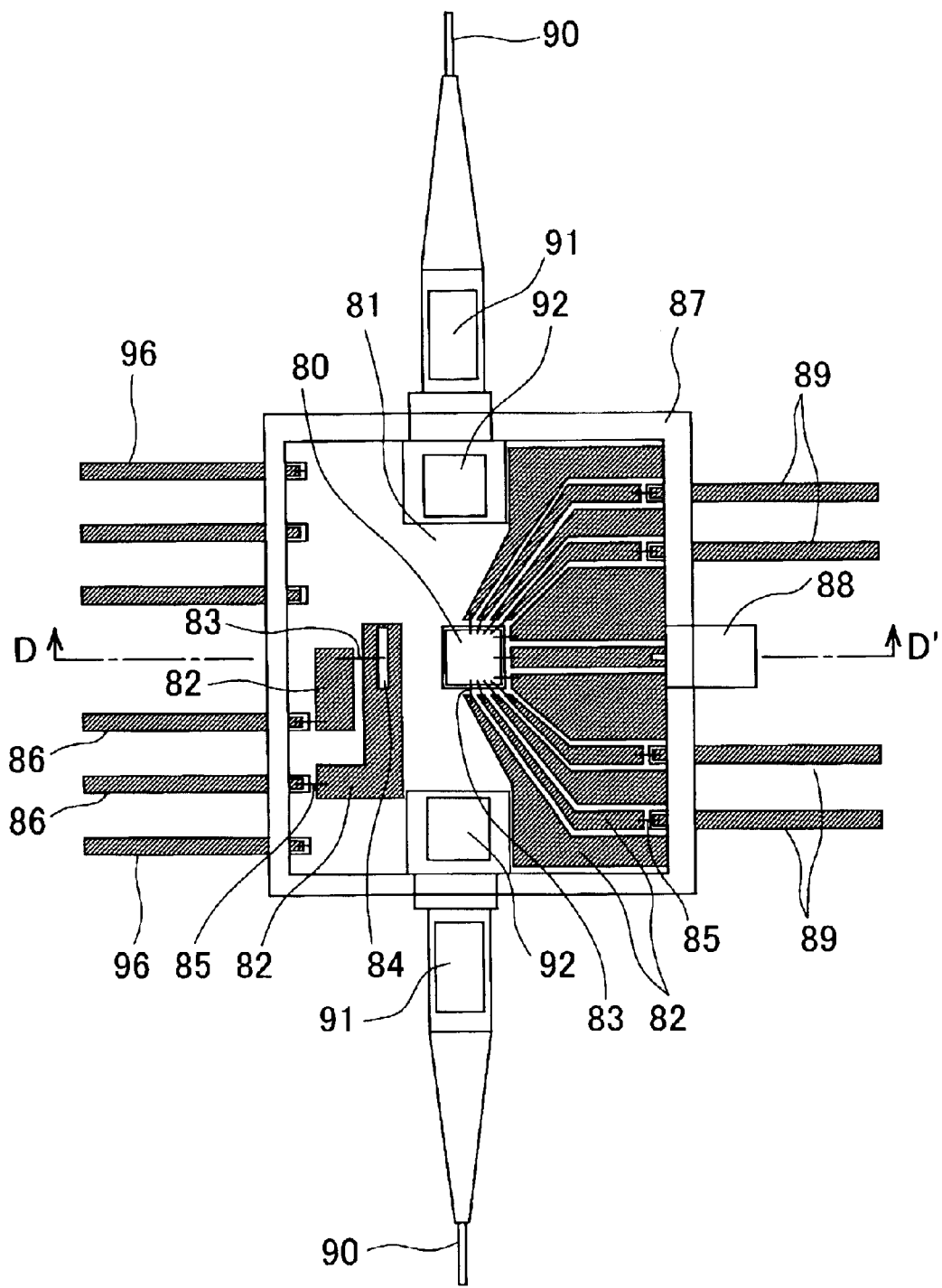
FIG. 2 is a top view of the interior of a module for optical transmitter studied prior to the invention, seen by removing the upper part of the storage case thereof.
Figure 3:
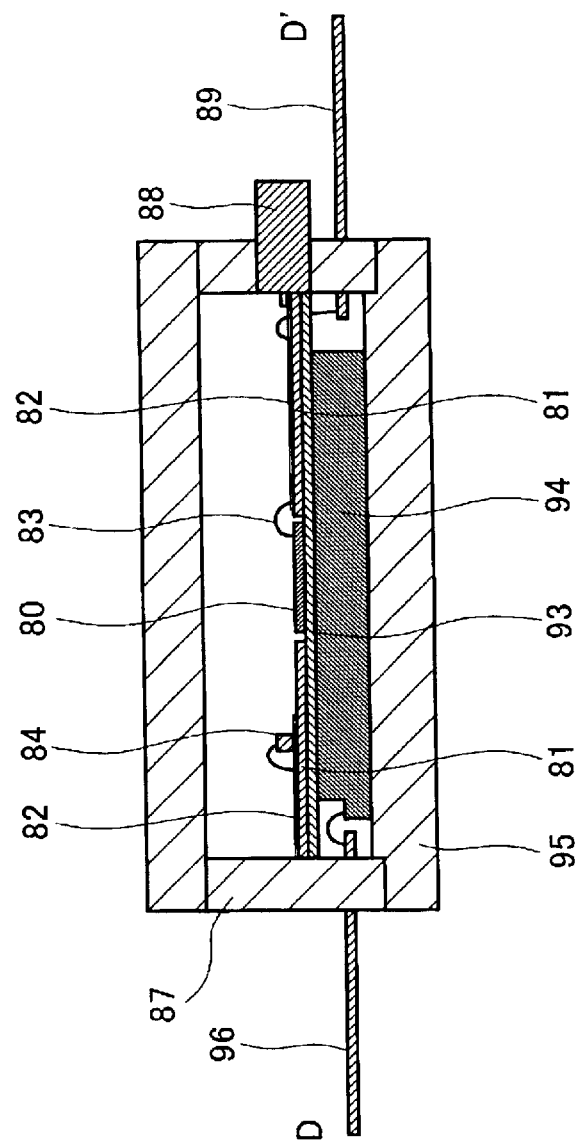
FIG. 3 is a side view seen from the cross section along line D-D' shown in FIG. 2.
Figure 4:
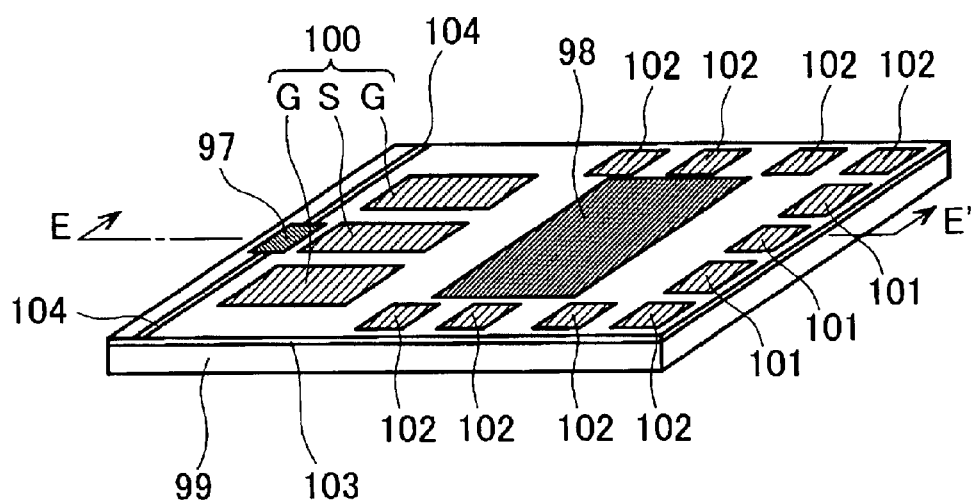
FIG. 4 is a perspective view of the prototyped OEIC chip.
Figure 5:
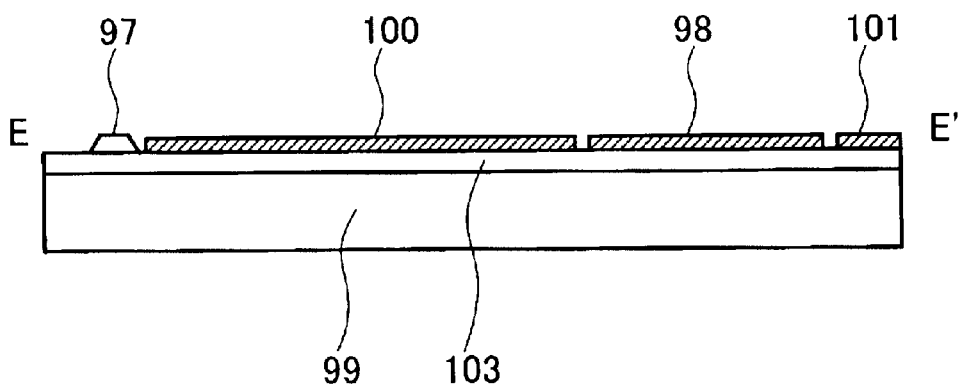
FIG. 5 is a cross sectional view of the portion along line E-E' shown in FIG. 4.
Figure 6:
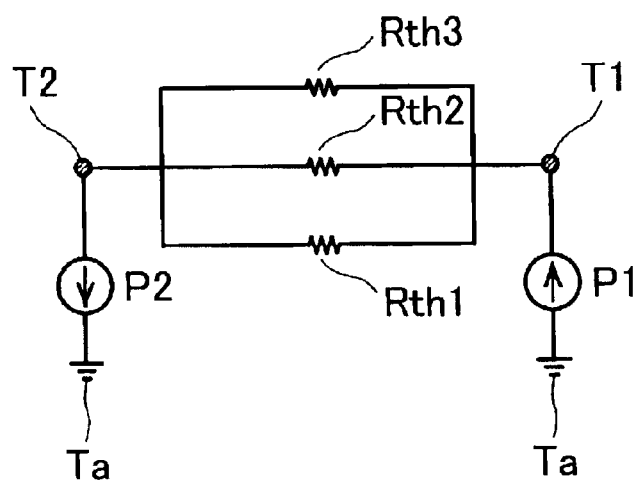
FIG. 6 is a simplified thermal path of the prototyped module for optical transmitter.
Figure 7:
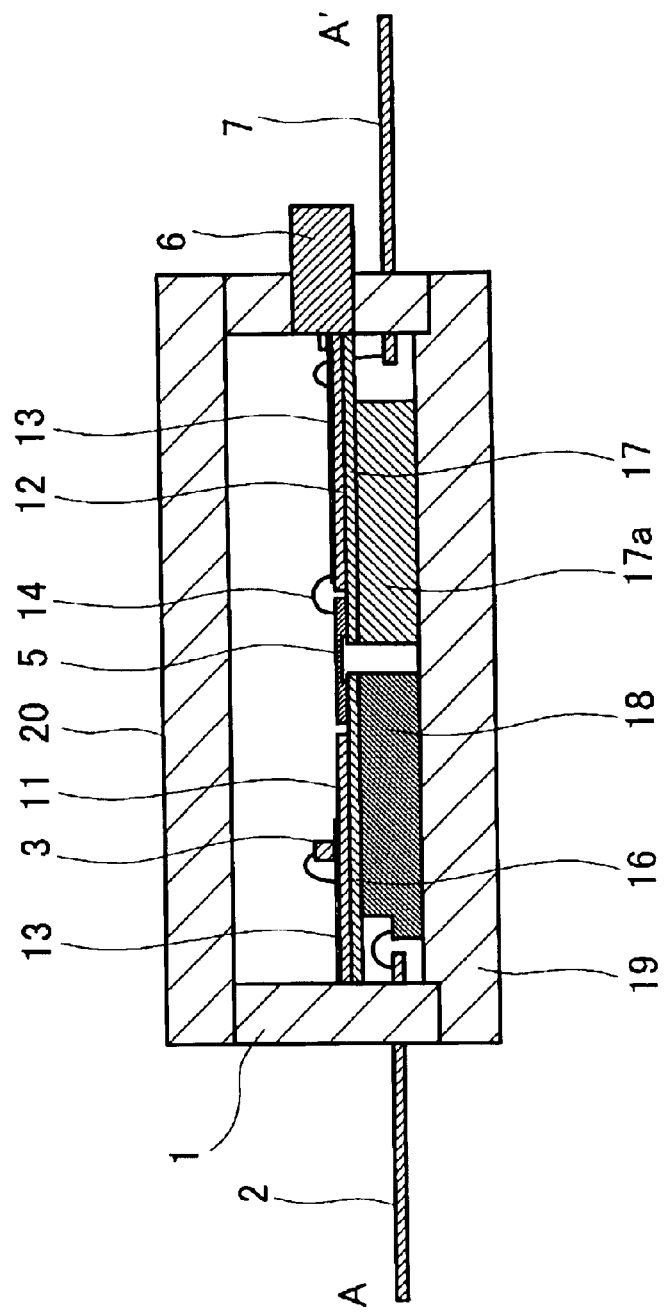
FIG. 7 is a side view seen from the cross section of the portion along line A-A' shown in FIG. 1.
Figure 8:
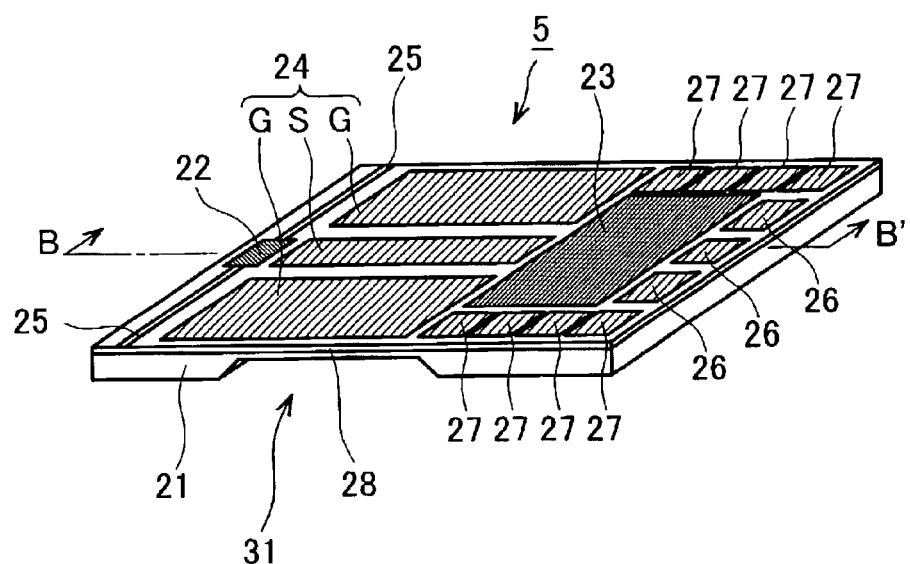
FIG. 8 is a perspective view of an OEIC chip to be used in the module for optical transmitter of the first embodiment.
Figure 9:
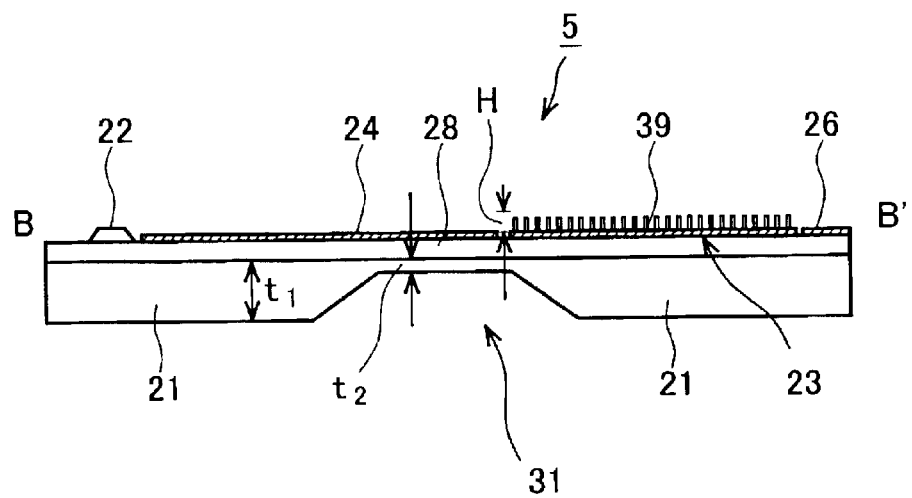
FIG. 9 is a cross sectional view of the portion along line B-B' shown in FIG. 8.

FIG. 1 is a view for showing a first embodiment of a module for optical transmitter of the present invention, and a top view of the interior seen by removing the upper part of the storage case of the module for optical transmitter. FIG. 7 is a side view seen from the cross section of the portion along line A-A' shown in FIG. 1. FIG. 8 is a perspective view of an OEIC chip used in the module for optical transmitter of this embodiment. FIG. 9 is a cross sectional view of the portion along line B-B' shown in FIG. 8.

The module for optical transmitter of the present invention shown in FIG. 1 has, in a storage case 1 made of a metal, an I/O terminal 2 of a peltier cooler 18 (see FIG. 7), an I/O terminal 4 of a thermister 3 for detecting the inside temperature of the module, a connector 6 for inputting a high-frequency signal to the OEIC chip 5, a terminal 7 for applying dc voltage, and isolator 8, a single mode fiber 9, and an aspherical lens 10 for fiber coupling.

Inside the module, there are a first ceramic substrate 11 and a second ceramic substrate 12. The thermister 3 is connected to an Au-plated wire 13 formed on the first ceramic substrate 11 by a bonding wire 14. Further, the OEIC chip 5 is connected to another Au-plated wire 13 formed on the second ceramic substrate 12 by another bonding wire 14. Each Au-plated wire 13 and each I/O terminal are connected by a lead wire 15.

Further, as shown in FIG. 7, the OEIC chip 5 is mounted across a first carrier 16 and a second carrier 17 made of CuW, and connected to the Au-plated wire 13 formed on the second ceramic substrate 12 by the bonding wire 14.

The first carrier 16 on which the optical modulator 22 (see FIG. 8) side of the OEIC chip 5 is mounted is, as shown in FIG. 7, mounted on the peltier cooler 18. Further, the peltier cooler 18 is fixed on the bottom 19 of the storage case. Upon supplying a prescribed current through the I/O terminal 2 of the peltier cooler 18, heat absorption occurs on the upper part of the peltier cooler 18. This allows cooling of the optical modulator portion of the OEIC chip 5 on the carrier. Further, the heat corresponding to the absorbed heat is generated in the lower part of the peltier cooler 18 at this step. The generated heat is dissipated outside through the bottom 19 of the storage case, the storage case 1, and the top 20 of the storage case. An adjustment carrier 17a for adjusting the height is disposed under the carrier 17 closer to the driver circuit 23 for modulator (see FIG. 8).

For the OEIC chip 5, as shown in the perspective view of FIG. 8, a compound semiconductor substrate, i.e., an InP substrate 21 is herein used. On the InP substrate 21, the opto-electronic optical modulator 22 and the driver circuit 23 for modulator are formed, and both are connected by a characteristic impedance-matched transmission line (G-S-G line) 24. Further, an optical waveguide 25 is connected to the opto-electronic optical modulator 22.

To the driver circuit 23 for modulator, are connected a pad 26 for inputting a high-frequency signal and a pad 27 for applying a dc current. The respective pads 26 and 27 are formed on an inter layer insulating film 28. Further, the OEIC chip 5 is provided with a groove 31 in a part of the InP substrate 21 immediately under the transmission line 24 for controlling the thermal conduction from the substrate. In this embodiment, the thickness $t_2$ of the substrate shown in FIG. 9 at the portion serving as the groove 31 is set to be 20 μm. Convex cooling plates 33 are disposed on the metal wiring on the side of the OEIC chip 5 on which the driver circuit 23 for modulator is to be formed. This results in the cooling area about three times larger than that in the case where there is no cooling plate. The cooling plates have a height of 5 μm and a spacing of 3 μm.

Herein, the convex cooling plates 33 may be formed, for example, in the following manner.

On a metal thin film layer as an underlayer formed by Au evaporation, Au plating is applied using a photoresist pattern as a mask, and then the resist is removed. Namely, the formation of the cooling plates 33 can be implemented only by adding the photoresist step and the Au-plating step subsequent to the step of forming the metal wiring 24 and the pads 26 and 27 on the OEIC chip 5.

Incidentally, the photoresist pattern may be in the form of parallelly arranged long rectangular patterns so that the resulting convex cooling plates 33 are in the form of parallel plates. Alternatively, if the intended convex cooling plates 33 are square-pole or cylindrical cooling plates arranged in a matrix, the photoresist pattern may be in the form of square or circular patterns arranged in a matrix. Incidentally, FIG. 9 shows the diagram in which no cooling plate is disposed on the pads 26 and 27. However, it is also acceptable that cooling plates are disposed at a position not obstructing bonding wires on the pads 26 and 27.

Figure 10:
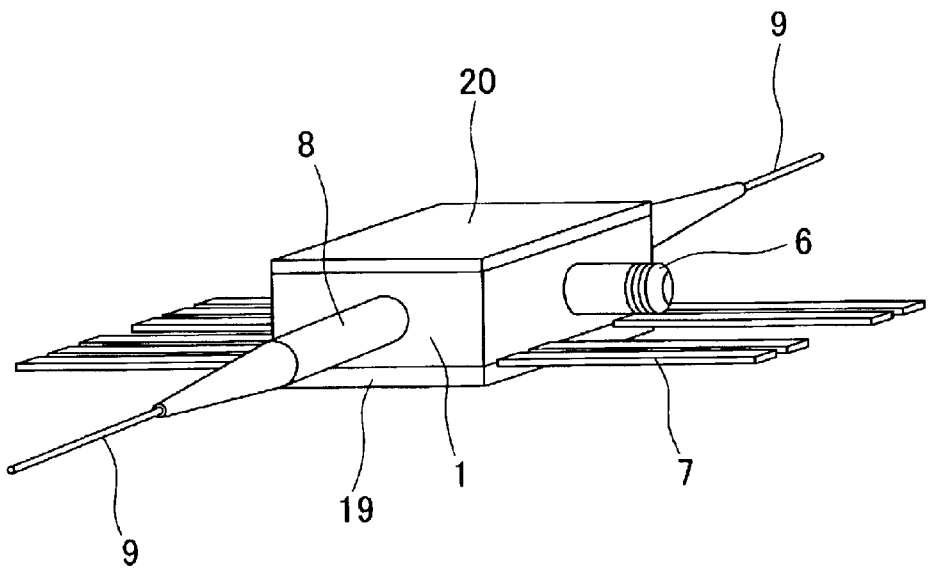
FIG. 10 is a perspective view of a module for transmitter in accordance with the present invention.

FIG. 10 is a perspective view of a completed module for transmitter, which is hermetically sealed by filling an inert gas inside the module and welding the top 20 of the storage case 1.

Figure 11:
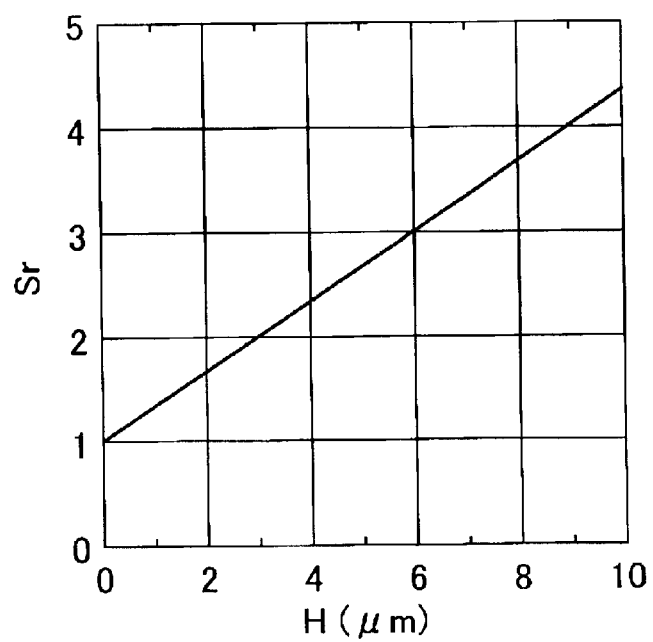
FIG. 11 is a characteristic diagram for showing the dependence of the ratio of the cooling areas between when there is no cooling plate and when convex cooling plates are provided on the height of each convex cooling plate.

In accordance with this embodiment, by the cooling plates 33 disposed on the driver circuit 23 for modulator of the OEIC chip 5, it is possible to obtain a cooling area about three times larger than that in prior art as shown in FIG. 11. This produces an effect of reducing the thermal resistance, and thereby allowing a reduction in temperature rise. Incidentally, in FIG. 11, the ordinate denotes the ratio Sr of the cooling areas between when there is no cooling plate and when convex cooling plates are provided at a spacing of 3.0 μm, and the abscissa denotes the height H (μm) of each convex cooling plate.

Figure 12:
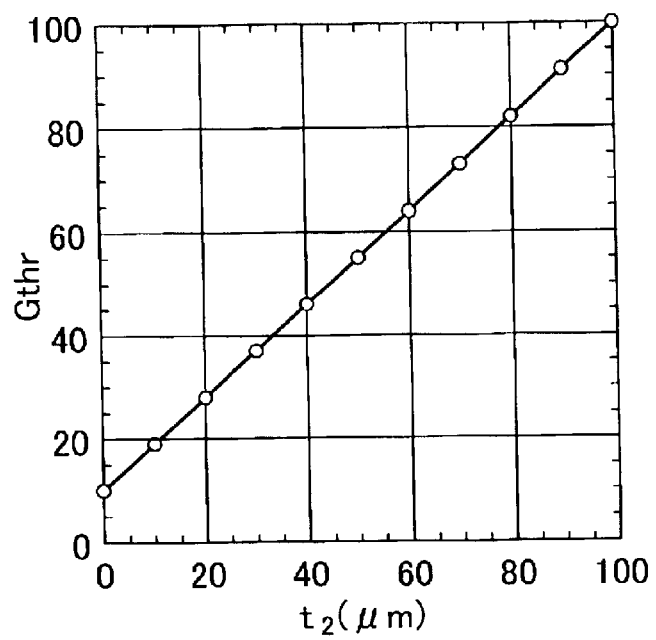
FIG. 12 is a characteristic diagram for showing that the thermal conductance ratio depends upon the substrate thickness at a groove.

Further, by the groove 31 provided in the back of the InP substrate 21, it is possible to prevent the heat generated at the driver circuit 23 for modulator from conducting toward the opto-electronic optical modulator 22. FIG. 12 is a characteristic diagram showing that the thermal conductance ratio depends upon the substrate thickness $t_2$ at the groove. In the diagram, the abscissa denotes the substrate thickness $t_2$ at the groove, and the ordinate denotes the ratio Gthr between the thermal conductance (the inverse of the thermal resistance) at the thickness $t_1$ of the substrate and the thermal conductance at the substrate thickness $t_2$. The thickness $t_1$ of the substrate is set to be 100 μm. As indicated from FIG. 12, by providing the groove 31, and thereby setting the substrate thickness $t_2$ at the groove to be 20 μm, the effect of thermal conduction is reduced down to ⅓ as compared with the InP substrate provided with no groove.

Further, there is observed an effect of capable of cooling only the part of the opto-electronic optical modulator 22 because the carrier for mounting the OETC chip 5 thereon is divided into two parts: the first carrier 16 and the second carrier 17.

By the foregoing thermal stabilization, a module for optical transmitter causing a small loss of electric signal, and having an excellent extinction characteristic was implemented.

(Embodiment 2)

Then, a second embodiment of the module for optical transmitter of the present invention will be described by reference to FIGS. 1, and 12 to 14. This embodiment is characterized in that the groove 31 provided in the OEIC chip 5 shown in FIG. 8 in the first embodiment is further deepened to completely remove the InP substrate at the portion of the groove 31. It is noted that parts having like configurations are indicated with like reference characters and numerals throughout Embodiments 1 and 2.

Figure 13:
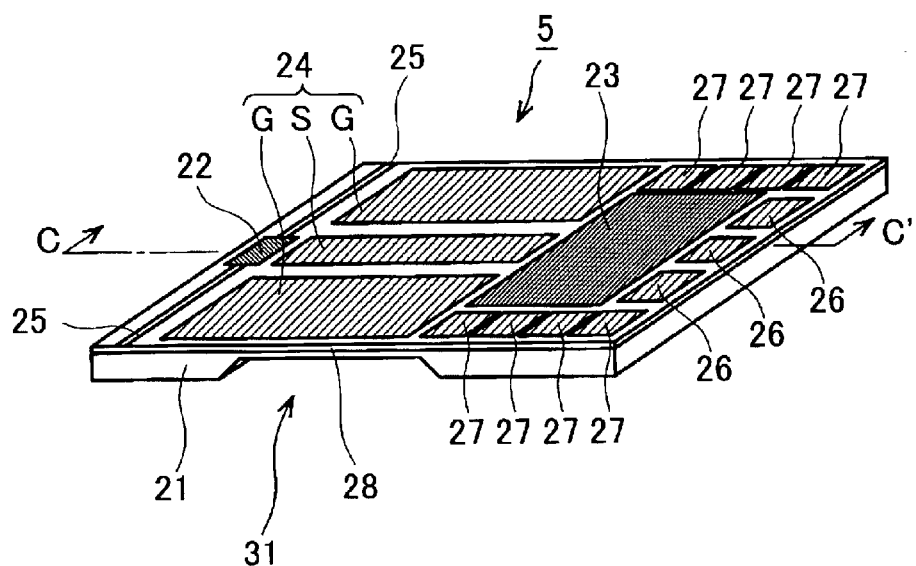
FIG. 13 is a perspective view of an OEIC chip to be used for a module for optical transmitter of a second embodiment.
Figure 14:
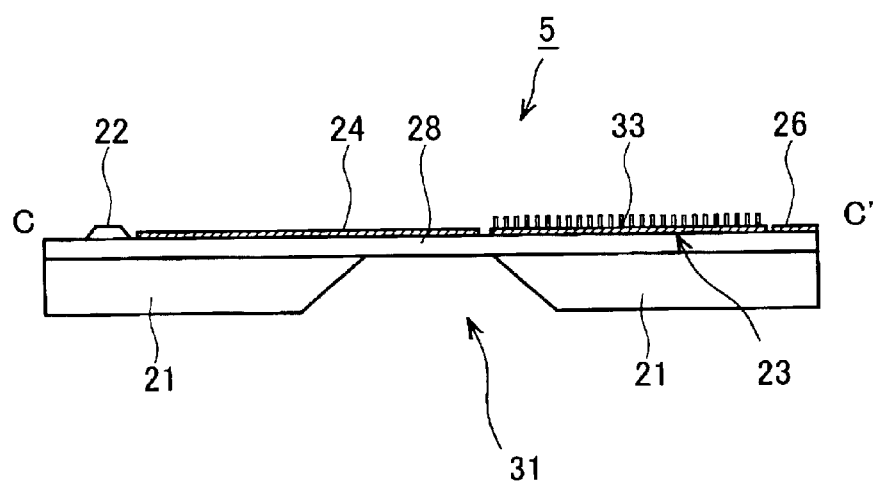
FIG. 14 is a cross sectional view of the portion along line C-C' shown in FIG. 13.

A module for optical transmitter having the same configuration as that of FIG. 1 is manufactured. However, it is different from Embodiment 1 in that a chip having the configuration shown in FIGS. 13 and 14 is used as the OEIC chip 5. FIG. 13 is a perspective view of the OEIC chip 5 to be used in the module for optical transmitter of this embodiment. FIG. 14 is a cross sectional view of the portion along line C-C' shown in FIG. 13. The perspective view of the completed module for optical transmitter is identical to FIG. 10 of Embodiment 1.

As shown in FIG. 13, the groove 31 provided in the InP substrate 21 reaches the interlayer insulating film 28, so that the semiconductor substrate layer 21 at the portion of the groove 31 is completely removed. With this configuration, it is possible to eliminate the transfer of heat generated at the driver circuit 23 for modulator toward the opto-electronic optical modulator 22 through thermal conduction via the substrate 21.

In accordance with this embodiment, by the groove 31 provided in the back of the InP substrate 21, it is possible to prevent the heat generated at the driver circuit 23 for modulator from conducting toward the opto-electronic optical modulator 22. The configuration of this embodiment corresponds to the configuration in the case where the substrate thickness $t_2$ at the groove portion of the characteristic diagram shown in FIG. 12 is equal to zero. Therefore, the effect is reduced down to about 1/10 as compared with the InP substrate not provided with the groove 31. By the foregoing thermal stabilization technology, it is possible to implement a module for optical modulator having a more excellent extinction characteristic than that of the module for optical transmitter shown in the first embodiment, and having an excellent transmission characteristic.

(Embodiment 3)

Figure 15:
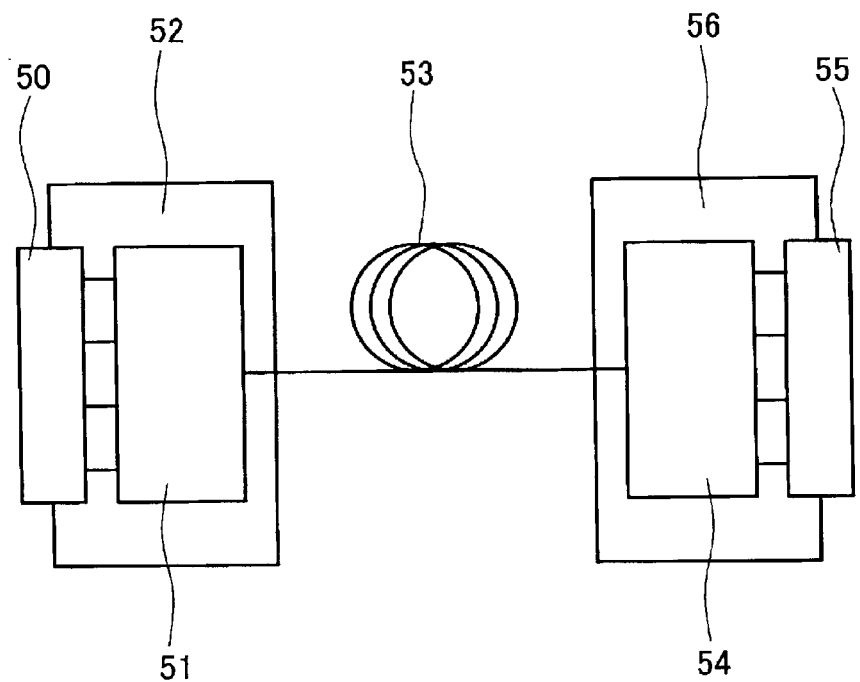
FIG. 15 is a block diagram of an optical transmission system using the module for optical transmitter in accordance with the present invention.
Figure 16:
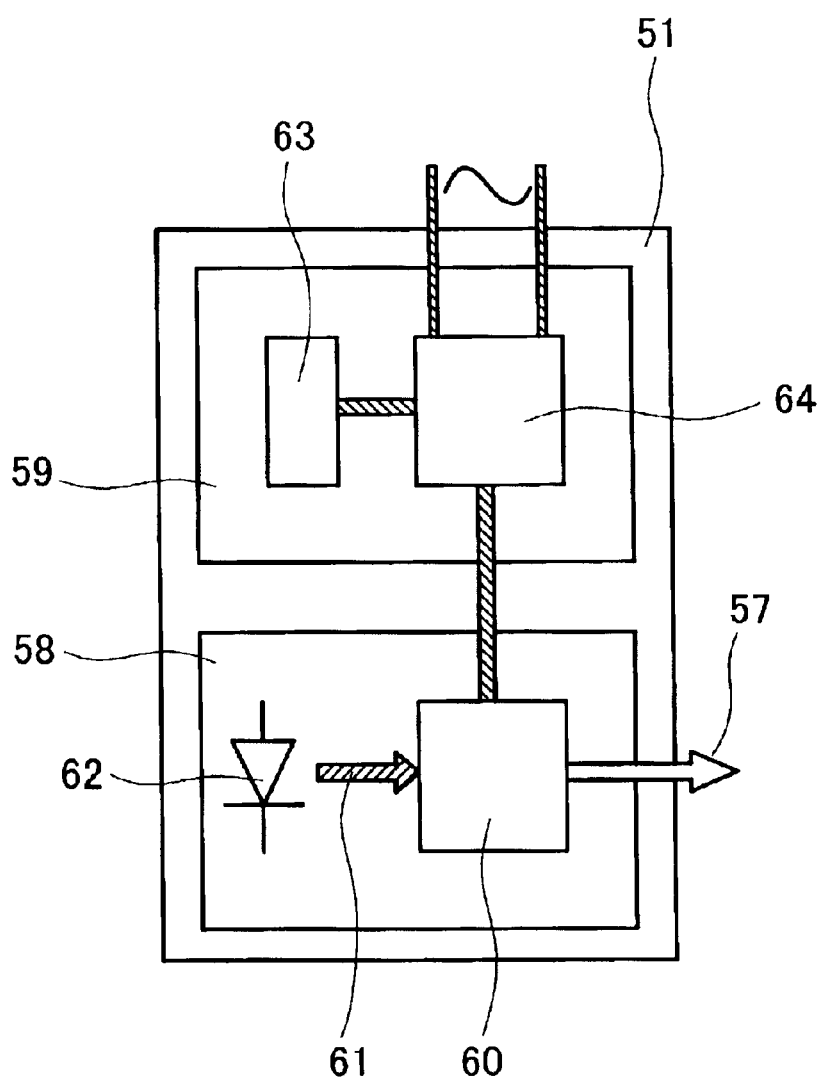
FIG. 16 is a block diagram for showing the configuration of an optical transmitter unit in the optical transmission system shown in FIG. 15.
Figure 17:
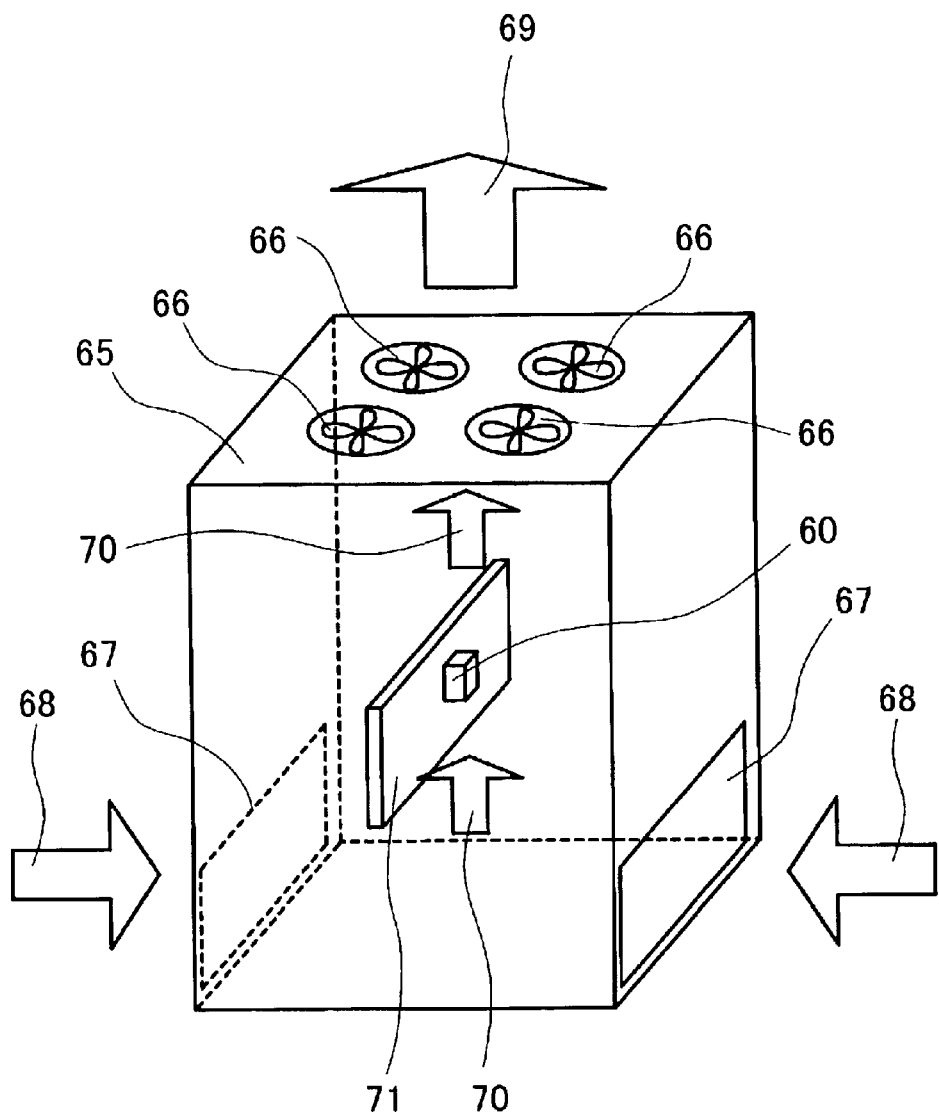
FIG. 17 is a perspective view of an optical transmission equipment having the optical transmission system shown in FIG. 15.

An optical transmission system using the module for optical transmitter shown in the first or second embodiment by reference to FIGS. 15 to 17. FIG. 15 is a block diagram of an optical transmission system using a module for optical transmitter in accordance with the present invention. The optical transmission system shown in FIG. 15 is made up of an optical transmitter 52, an optical fiber 53 for transmitting an optical signal, and an optical receiver 56. Further, the optical transmitter 52 is made up of an electric signal input port 50 and an optical transmitter unit 51 for converting an input digital electric signal into an optical signal. Whereas, the optical receiver 56 is made up of an optical receiver unit 54 for converting an optical signal into a digital electric signal, and an electric signal output port 55 for outputting a digital electric signal.

FIG. 16 is a block diagram showing a configuration of the optical transmitter unit 51 in the optical transmitter 52 in the optical transmission system shown in FIG. 15. As shown in FIG. 16, the optical transmitter unit 51 is made up of a modulated optical transmitter unit 58 and a high speed logic circuit 59 for transmitter. The high speed logic circuit 59 for transmitter is made up of a multiplexer 64 for converting a plurality of digital input electric signals into a multiplexed digital electric signal and a PLL (Phase Locked Loop) for unifying the phases of the multiplexed digital electric signal. The modulated optical transmitter unit 58 is made up of a laser diode 62, and an optical modulator 60 composed of an opto-electronic optical modulator which uses a laser light 61 therefrom as an input, modulates the laser light 61 in response to the multiplexed digital electric signal from the multiplexer 64, and outputs an optical signal 57, and a driver circuit for modulator.

An optical transmitter 52 is manufactured by using the foregoing module for optical transmitter of the first or second embodiment for the optical modulator 60 composed of the opto-electronic optical modulator and the driver circuit for modulator thus configured. Further, the optical transmitter 52 and the optical receiver 56 are placed in an optical transmission equipment shown in FIG. 17. A housing 65 is provided with cooling fans 66 and air inlets 67. Thus, it is so configured that outside air is taken into the housing 65 and discharged through the top as an exhaust gas 69. Further, the optical modulator 60 using the module for optical transmitter of the present invention is fixedly placed on the base 71 of the optical transmitter so as to be exposed to the airflow in the housing 65.

In accordance with this embodiment, it is possible to configure an optical transmitter by using one module for optical transmitter for the opto-electronic optical modulator and the driver circuit for modulator. As a result, it is possible to provide a more compact optical transmitter than prior-art ones. Further, it is possible to manufacture an optical transmission equipment by using the optical transmitter. This produces an effect of capable of implementing an optical transmission system which is compact in size, and has a good transmission characteristic.

Up to this point, the present invention has been described by way of preferred embodiments, which should not be construed as limiting the scope of the invention. It is needless to say that various changes and modifications may be made in the invention without departing from the spirit and scope thereof. For example, in the foregoing embodiment, as the input of a high-frequency signal to the OEIC chip, there was shown the example of single input. However, it is needless to say that differential input is also acceptable. Further, in the foregoing embodiment, there was shown the example of the OEIC chip in which the opto-electronic optical modulator and the driver circuit for modulator are integrated. However, it is also acceptable that the OEIC chip is configured by further using a modulator integrated DFB (Distributed Feed Back) laser diode in which DFB laser diodes are integrated for the optical modulator part.

As apparent from the foregoing embodiments, in accordance with the present invention, it is possible to provide a compact module for optical transmitter mounting an OEIC chip thereon which suppresses the temperature rise and the temperature change of an optical modulator, and thereby undergoes no characteristic deterioration and has an excellent electric signal—optical signal response characteristic. Further, it is possible to configure compact optical communication equipment and optical transmission system by using the module for optical transmitter.

What is claimed is:

1. A module for optical transmitter mounting therein an IC chip including an opto-electronic optical modulator and a driver circuit for modulator formed as en opto-electronic integrated circuit on the same semiconductor substrate, the IC chip having a first semiconductor substrate area and a second semiconductor substrate area having a large thickness and separated by a groove formed by thinning a part of the semiconductor substrate immediately under a wiring metal for connecting the opto-electronic optical modulator and the driver circuit for modulator, the opto-electronic optical modulator being formed on the first semiconductor substrate area side, and the driver circuit for modulator being formed on the second semiconductor substrate area side, the module for optical transmitter, further comprising:
- a first carrier for mounting the first semiconductor substrate area side of the IC chip, and a second carrier for mounting the second semiconductor substrate area side of the IC, placed apart from each other;
- a peltier cooler connected to the first carrier; and further
- a protruding cooling plate formed on the driver circuit for modulator on the IC chip.

2. The module for optical transmitter according to claim 1, wherein the wiring metal is a distributed transmission line.

3. The module for optical transmitter according to claim 1, wherein the semiconductor substrate is an InP substrate.

4. A module for optical transmitter mounting therein an IC chip including an opto-electronic optical modulator and a driver circuit for modulator formed as an opto-electronic integrated circuit on the same semiconductor substrate, the IC chip having a first semiconductor substrate area and a second semiconductor substrate area separated by a groove formed by removing a part of the semiconductor substrate immediately under a wiring metal for connecting the opto-electronic optical modulator and the driver circuit for modulator, the opto-electronic optical modulator being formed on the first semiconductor substrate area side, and the driver circuit for modulator being formed on the second semiconductor substrate area side, the module for optical transmitter, further comprising:
- a first carrier (or mounting the first semiconductor substrate area side of the IC chip, and a second carrier for mounting the second semiconductor area side of the IC, placed apart from each other;
- a peltier cooler connected to the first carrier; and further
- a protruding cooling plate formed on the driver circuit for modulator on the IC chip.

5. The module for optical transmitter according to claim 4, wherein the wiring metal is a distributed transmission line.

6. The module for optical transmitter according to claim 4, wherein the semiconductor substrate is an InP substrate.

7. A communication equipment, comprising:

a plurality of digital electric signals; a multiplexer for converting the digital electric signals into a multiplexed digital electric signal; a driver circuit for modulator for amplifying the multiplexed digital electric signal; and a modulator for modulating a light emitted from an optical element, and thereby converting the multiplexed digital electric signal into an optical signal, the communication equipment comprising die module for optical transmitter according to a module for optical transmitter mounting therein an IC chip including an opto-electronic optical modulator and a driver circuit for modulator formed as an opto-electronic integrated circuit on the same semiconductor substrate, the IC chip having a first semiconductor substrate area and a second semiconductor substrate area having a large thickness and separated by a groove Loomed by thinning a part of the semiconductor substrate immediately under a wiring metal for connecting the opto-electronic optical modulator and the driver circuit for modulator, the opto-electronic optical modulator being formed on the faint semiconductor substrate area side, and the driver circuit for modulator being formed on the second semiconductor substrate area side, the module for optical transmitter, further comprising:
- a first carrier for mounting the first semiconductor substrate area side of the IC chip, and a second carrier for mounting the second semiconductor substrate area side of the IC, placed apart from each other;
- a peltier cooler connected to the first carrier, and further
- a protruding cooling plate formed on the driver circuit for modulator on the IC chip.

8. An optical transmission system comprising:

an optical transmitter for converting an electric signal into an optical signal; an optical fiber for transmitting the optical signal; and an optical receiver for converting the optical signal into an electric signal, the optical transmission system comprising the communication equipment according to a communication equipment, comprising:

a plurality of digital electric signals; a multiplexer for converting the digital electric signals into a multiplexed digital electric signal; a driver circuit fix modulator for amplifying the multiplexed digital electric signal; and a modulator for modulating a light emitted from an optical element, and thereby converting the multiplexed digital electric signal into an optical signal, the communication equipment comprising the module for optical transmitter according to a module for optical transmitter mounting therein an IC chip including an opto-electronic optical modulator and a driver circuit for modulator formed as an opto-electronic integrated circuit on the same semiconductor substrate, the IC chip having a first semiconductor substrata area and a second semiconductor substrate area having a large thickness and separated by a groove formed by thinning a part of the semiconductor substrate immediately under a wiring metal for connecting the opto-electronic optical modulator and the driver circuit for modulator, the opto-electronic optical modulator biting formed on the first semiconductor substrate area side, and the driver circuit for modulator being formed on the second semiconductor substrate area side, the module for optical transmitter, further comprising:
- a first carrier for mounting the first semiconductor substrate area side of the IC chip, and a second carrier for mounting the second semiconductor substrate area side of the IC, placed apart from each other;
- a peltier cooler connected to the first carrier; and further
- a protruding cooling plate formed on the driver circuit for modulator on the IC chip.

9. A communication equipment, comprising:

a plurality of digital electric signals; a multiplexer for converting the digital electric signals into a multiplexed digital electric signal; a driver circuit for modulator for amplifying the multiplexed digital electric signal; and a modulator for modulating a light emitted from an optical element, and thereby converting the multiplexed digital electric signal into an optical signal, the communication equipment comprising a module for an optical transmitter mounting therein an IC chip including an opto-electronic optical modulator and a driver circuit for modulator formed as an opto-electronic integrated circuit on the same semiconductor substrate, the IC chip having a first semiconductor substrate area and a second semiconductor substrate area having a large thickness and separated by a groove formed by thinning a part of the semiconductor substrate immediately under a wiring metal for connecting the opto-electronic optical modulator and the driver circuit for modulator, the opto-electronic optical modulator being formed on the first semiconductor substrate area side, and the driver circuit for modulator being formed on the second semiconductor substrate area side, the module for optical transmitter further comprising:

a first carrier for mounting the first semiconductor substrate area side of the IC chip, and a second carrier for mounting the second semiconductor substrate area side of the IC, placed apart from each other;

a peltier cooler connected to the first carrier; and further a protruding cooling plate formed on the driver circuit for modulator on the IC chip.

10. An optical transmission system comprising:

an optical transmitter for converting an electric signal into an optical signal; an optical fiber for transmitting the optical signal; and an optical receiver for converting the optical signal into an electric signal, the optical transmission system comprising the communication equipment, comprising:

a plurality of digital electric signals; a multiplexer for converting the digital electric signals into a multiplexed digital electric signal; a driver circuit for modulator for amplifying the multiplexed digital electric signal; and a modulator for modulating a light emitted from an optical element, and thereby converting the multiplexed digital electric signal into an optical signal, the communication equipment comprising a module for an optical transmitter mounting therein an IC chip including an opto-electronic optical modulator and a driver circuit for modulator formed as an opto-electronic integrated circuit on the same semiconductor substrate, the IC chip having a first semiconductor substrate area and a second semiconductor substrate area having a large thickness and separated by a groove formed by thinning a part of the semiconductor substrate immediately under a wiring metal for connecting the opto-electronic optical modulator and the driver circuit for modulator, the opto-electronic optical modulator being formed on the first semiconductor substrate area side, and the driver circuit for modulator being formed on the second semiconductor substrate area side, the module for optical transmitter, further comprising:

a first carrier for mounting the first semiconductor substrate area side of the IC chip, and a second carrier for mounting the second semiconductor substrate area side of the IC, placed apart from each other;

a peltier cooler connected to the first carrier; and further a protruding cooling plate formed on the driver circuit for modulator on the IC chip.

* * * * *